(12) United States Patent
Takahashi et al.

(10) Patent No.: US 6,687,166 B1
(45) Date of Patent: Feb. 3, 2004

(54) BUS INTERFACE CIRCUIT AND RECEIVER CIRCUIT

(75) Inventors: Hiroyuki Takahashi, Kanagawa (JP); Yuuji Matsui, Kanagawa (JP); Hiroyuki Satake, Kanagawa (JP)

(73) Assignee: NEC Corporation, Kanagawa (JP)

( * ) Notice: Subject to any disclaimer, the term of this patent is extended or adjusted under 35 U.S.C. 154(b) by 0 days.

(21) Appl. No.: 10/461,583

(22) Filed: Jun. 13, 2003

(30) Foreign Application Priority Data

Jul. 19, 2002  (JP) ........................................ 2002-210627

(51) Int. Cl.[7] ................................................ G11C 7/10
(52) U.S. Cl. .................. 365/189.05; 365/227; 365/203; 365/208; 365/207; 326/27; 326/26
(58) Field of Search ............................ 365/189.05, 203, 365/227, 226, 190, 207, 208; 326/26, 27, 30, 62

(56) References Cited

U.S. PATENT DOCUMENTS 4,780,849 A * 10/1988 Nakagawa et al. .... 365/189.03
5,159,210 A * 10/1992 Eitrheim et al. ............... 326/86
5,461,330 A * 10/1995 Gist et al. ....................... 326/17

* cited by examiner

Primary Examiner—Andrew Q. Tran
(74) Attorney, Agent, or Firm—Choate, Hall & Stewart

(57) ABSTRACT

A bus interface circuit includes a precharge circuit including a switch element which is inserted between a bus line and a precharge power supply, receives a precharge control signal PE at its control terminal, and is turned on when the precharge control signal is active. The precharge circuit precharges the bus line to a predetermined precharge voltage from the precharge power supply via the switch element that is turned on. The precharge voltage is a predetermined voltage between a high-potential power supply voltage VDD and a low-potential power supply voltage VSS. When a signal received by an output circuit for output to the bus line has a first logic value, an output circuit sets the bus line, which has been precharged to the precharge voltage, from the precharge voltage to the predetermined VSS.

19 Claims, 10 Drawing Sheets

FIG. 3 BUS DRIVE POWER

BUS INTERFACE CIRCUIT AND RECEIVER CIRCUIT

FIELD OF THE INVENTION

The present invention relates to a bus interface, and more particularly to a bus interface comprising an output circuit that drives a bus line, a precharge circuit that pre-charges the bus line, and a receiver circuit that receives a signal output to the bus line.

BACKGROUND OF THE INVENTION

A conventional bus control system for use in a memory device will be described. FIG. 8 is a diagram schematically showing an example of a conventional system configuration of a memory device. Referring to FIG. 8, a plurality of memory cell sub-array blocks $200_1$–$200_m$ are connected to a common bus line 210 to which a receiver circuit 220 is connected. The receiver circuit 220 receives data read from the sub-array blocks $200_1$–$200_m$ and outputs the received data.

The sub-array blocks $200_1$–$200_m$ each have the same configuration, with the configuration of the sub-array block $200_l$ shown in the figure. The sub-array block $200_l$ comprises a memory cell array 201 in which a plurality of word lines and bit lines, not shown, are arranged in row and column directions, respectively, with memory cells, each at the intersection of a bit line and a word line, arranged as an array; a word driver 202 for driving a word line selected by an X decoder, not shown, that receives an address signal; and a Y switch 203 for selecting a bit line selected by a Y decoder, not shown, that receives an address signal and connecting to a sense amplifier 204. A pair of complementary bit lines (T, B: B is a complementary signal of a bit line T), which are selected by the Y switch 203, are input to the sense amplifier 204. When a sense enable signal SE is activated, the sense amplifier 204 performs sense operation and outputs a resultant signal SAT to an output circuit 205. The output circuit 205 comprises an output buffer circuit composed of a PMOS transistor PM201 and an NMOS transistor NM201 connected in series between the high-potential power supply VDD and the low-potential power supply VSS; and a control circuit that controls the output buffer circuit. The output terminal of a NAND circuit 206, which executes a NAND operation of the sense enable signal SE and the output signal SAT of the sense amplifier 204, is connected to the gate of the PMOS transistor PM201. The output of a NOR circuit 207, which executes a NOR operation of the inverted signal of the sense enable signal SE and the output signal SAT of the sense amplifier 204, is connected to the gate of the NMOS transistor NM201.

The operation of the conventional output circuit 205 shown in FIG. 8 will be outlined. When the sense enable signal SE is at a high level and the output signal SAT output from the sense amplifier 204 is at a high level, the output of the NAND circuit 206 falls to a low level, the PMOS transistor PM201 is turned on, and the high-potential power upply VDD charges the bus line 210 to a high level.

When the sense enable signal SE is at a high level and the output signal SAT of the sense amplifier 204 is at a low level, the output of the NOR circuit 207 goes to a high level, the NMOS transistor NM201 is turned on, and the electric charge on the bus line 210 is discharged to the low-potential power supply VSS and the bus line 210 is set to a low level.

FIG. 9 is a timing diagram showing an example of an operation of the conventional memory device shown in FIG. 8. Referring to FIG. 9, SE indicates the sense enable signal, P indicates the voltage of the gate of the PMOS transistor PM201 in FIG. 8 (voltage of the node indicated by P in FIG. 8), BS indicates the voltage waveform of the bus line 210 near (BS) the output circuit 205 in FIG. 8, BE indicates the voltage waveform of the bus line 210 near the input terminal of the receiver circuit 220 at the far-end (BE) of the output circuit 205 in FIG. 8, and OUT indicates the output signal waveform of the receiver circuit 220.

The sense amplifier 204 is activated on a rising edge of the sense enable signal SE. When the output signal SAT of the sense amplifier 204 is at a high level, the output P of the NAND circuit 206 falls to a low level, the PMOS transistor PM201 is turned on, and the bus line is charged by the high-potential power supply VDD. The voltage waveform of the bus line 210 at the input terminal of the receiver circuit 220 rises as BE in FIG. 9. The receiver circuit 220 is a circuit that differentially receives the input terminal voltage and the reference voltage to perform differential amplification. When the voltage BE of the input terminal (a rise time thereof being slow) exceeds the reference voltage, the output signal OUT is switched from a high level to a low level. In this case, when the bus line 210 is long and its capacitive load becomes large, the rising slope of BE (slew rate) becomes more dull with an increase in delay time between the activation of the sense enable signal and the output of the output signal OUT. This delay time results in an increase in access time and becomes one of the limiting factors of the high-speed operation of the memory system.

On the other hand, an increase in current drive capability of the output buffer circuit in an attempt to speed up a transition time of a signal at the far-end of the bus line would lead to an increase in power consumption. An attempt to reduce the rise time of an output signal to the high-potential power supply in the output buffer circuit, requires that a ratio of gain factors β between the PMOS transistor and NMOS transistor, β p/ β n, be set to a large value and that the PMOS transistor size be large enough. Note that β is given as $(\mu\epsilon/t_{ox})(W/L)$, where, $\mu$ is a carrier mobility, $\epsilon$ a dielectric constant of a gate insulating film, $t_{ox}$ is a thickness of the gate insulating film, W is a channel width, and L is a channel length.

SUMMARY OF THE DISCLOSURE

Accordingly, it is an object of the present invention to provide a bus system, a bus interface circuit, a receiver circuit, and a semiconductor device including the above mentioned circuits, which realize a high-speed operation with laying restraint on the increase of power consumption or without increasing power consumption.

The above and other objects are attained by a bus interface circuit according to one aspect of the present invention, which comprises a precharge circuit including a switch element that is inserted between a bus line and a precharge power supply terminal and that is turned on or off based on a precharge control signal controlling a precharge operation, the precharge circuit precharging the bus line to a predetermined precharge voltage via the switch element that is turned on by the precharge power supply terminal during the precharge operation, wherein the precharge voltage is a predetermined voltage between two power supply voltages of two power supplies, first and second, which drive a receiver circuit and/or an output circuit, the receiver circuit receiving a signal output from the output circuit to the bus line and wherein the output circuit comprises means for outputting an output signal to the bus line, a logic amplitude of the output signal being determined by the precharge voltage and a predetermined fixed voltage which is one of the first and second power supply voltages.

In the bus interface circuit according to the present invention, the output circuit preferably comprises means that drives the bus line, which is precharged to the precharge voltage, to set the voltage of the bus line from the precharge voltage to the predetermined fixed voltage when a signal to be output to the bus line is at a first logic level corresponding to the first power supply and that does not drive the bus line but holds the voltage of the bus line at the precharge voltage when a signal to be output to the bus line is at a second logic level corresponding to the second power supply.

According to the present invention, the bus line is precharged to the precharge voltage, and the output circuit is configured such that a signal whose amplitude is determined by the precharge voltage and the fixed voltage is output to the bus line. This configuration reduces the amplitude of the signal sent to the bus line and reduces the time required by the output circuit and the receiver circuit to access the bus.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
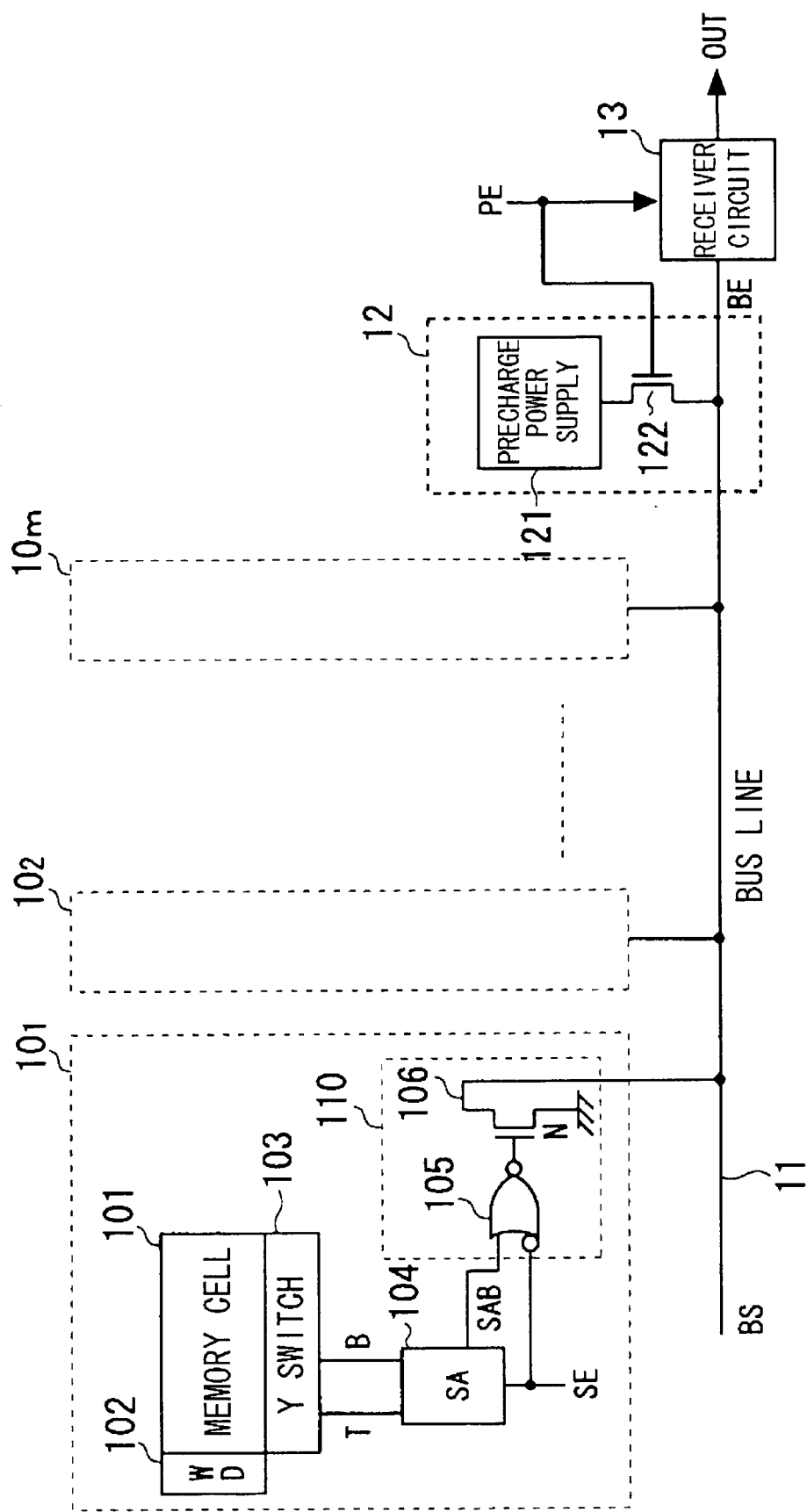
FIG. 1 is a diagram showing the configuration of one embodiment of the present invention.

Preferred embodiments of the present invention will be described. One embodiment of a bus interface circuit according to the present invention comprises a precharge circuit (12 in FIG. 1) that precharges a bus line (11 in FIG. 1) with a precharge voltage that is a predetermined voltage (also termed "intermediate voltage") between the high-potential power supply voltage (VDD) and the low-potential power supply voltage (VSS). The precharge circuit (12) comprises a switch element (122 in FIG. 1) that is turned on or off based on a precharge control signal (PE) controlling the precharge operation. The precharge circuit (12) precharges the bus line (11) for a predetermined period (termed "precharge period") before an output circuit (for example, 110 in FIG. 1) driving the bus line (11) starts the output operation, and stops the precharge operation when the output circuit (110) outputs the output signal to the bus line (11).

The output circuit (110), which outputs data to the bus line (11), comprises an output stage transistor (106) connected between the bus line (11) and the low-potential power supply voltage (VSS or ground). The output stage transistor (106) receives from its control terminal a signal to be output to the bus line (11) and, when the signal is at a first logic level, sets the bus line (11) from the precharge voltage to a predetermined fixed voltage (for example, low-potential power supply voltage VSS). When the signal fed to the control terminal is at a second logic level, the output stage transistor (106) is turned off to hold the bus line (11) at the precharge voltage. In this way, the logic amplitude of the signal sent to the bus line (11) is given as the low-potential power supply voltage (VSS) and a precharge voltage (Vp).

In one embodiment of the present invention, the reference voltage Vr of a differential circuit (comparator circuit), which determines the logic of the received signal in a receiver circuit (13) connected to the bus line (11) to receive a signal sent to the bus line (11), is a voltage between the precharge voltage Vp and the fixed voltage (low-potential power supply voltage).

In one embodiment of the present invention, a power supply circuit supplying the precharge voltage and the bus interface circuit may be provided commonly on a chip. A power supply circuit (14 in FIG. 4) comprises a plurality of resistors (R1, R2 and R3 in FIG. 4) connected in series between the high-potential power supply (VDD) and the low-potential power supply (VSS); and first and second driver circuits (driver circuits) each receiving an output voltage from a tap of the resistors corresponding to the precharge voltage (Vp) and the reference voltage (Vr) and outputting the precharge voltage and the reference voltage respectively. The first and second driver circuits may be configured by voltage followers (VF101 and VF102 in FIG. 4) each of which has the output terminal of the operational amplifier connected to the inverted input terminal and, based on the input voltage sent to the non-inverted input terminal, outputs the voltage from the output terminal.

In one embodiment of the present invention, the precharge circuit (12) comprises a transistor (NM104) that is connected between the output terminal of the first driver circuit (VF101) of the power supply circuit (14) and the bus line (11), that receives the precharge control signal (PE) at its control terminal, and that is turned on during the precharge operation to precharge the bus line.

In one embodiment of the present invention, the receiver circuit (13) comprises a differential circuit comprising a differential pair (NM101 and NM102) which has the bus line (11) and the output terminal of the second driver circuit (VF102) connected respectively to the differential input pair; a load element pair (PM101 and PM102) connected between the output pair of the differential pair and the high-potential power supply; and a constant current source (NM103) one end of which is connected to the common source of the differential pair, wherein the other end of the constant current source is connected to the low-potential power supply. This constant current source (NM103) receives the precharge control signal (PE) at its bias control terminal and is off during the precharge operation. The signal output from the differential circuit is sent to a buffer circuit (INV102) via a transfer gate (PM103 and NM105) that is off during the precharge operation based on the precharge control signal. The signal that is output to the bus line after the precharge period is received by the receiver circuit (13) and is then output from the output terminal (OUT) connected to the output terminal of the buffer circuit (INV102).

In another embodiment of the present invention, the precharge circuit (12) comprises a first transistor (NM111 in FIG. 5) connected between the precharge power supply (Vp2) and the bus line (11) to precharge the bus line (11); and an inverter (INV111) which receives the inverted signal of the precharge control signal (PE), with the precharge power supply voltage (Vp2) as the high-potential power supply voltage of the drive power supply, and whose output terminal is connected to the gate of the transistor (NM111). When the precharge control signal (PE) is active, the inverter (INV111) outputs the signal at the precharge power supply voltage (Vp2) to the gate of the transistor (NM111). When the transistor (NM111) is an NMOS transistor, the precharge power supply voltage (Vp2) is applied to the drain of the transistor (NM111), the precharge power supply voltage (Vp2) is applied to the gate, and the voltage of the source of the transistor (NM111) is the precharge power supply voltage (Vp2) minus the threshold voltage Vtn of the NMOS transistor (VP2−Vtn). The bus line 11 is precharged by this voltage.

In another embodiment of the present invention, the receiver circuit (13) comprises two transistors (PM111 and PM112), connected in parallel, with one of their ends tied together to the high-potential power supply (VDD); and a transistor (NM112) connected between the other ends, which are tied together, of the two transistors (PM111 and PM112) and the bus line (11) with its control terminal connected to the precharge power supply terminal (Vp2). The transistor (PM111) is turned on when the precharge control signal (PE) is active, and is turned off when the precharge control signal (PE) is inactive. The receiver circuit further comprises an inverter (INV112) whose input terminal is connected to the common connection point (node A) of the three transistors (PM111, PM112 and NM112) wherein the control terminal of the transistor (PM112) is connected to the output terminal of the inverter (INV112); a transfer gate (NM113 and PM113) one end of which is connected to the common connection point (node A) of the three transistors, which is turned off when the precharge control signal (PE) is active, and which is turned on when the precharge control signal (PE) is inactive; and a buffer circuit (INV113) whose input terminal is connected to the other end of the transfer gate. The output terminal of the buffer circuit (INV113) is connected to the output terminal (OUT) of the receiver circuit (13).

In another embodiment of the present invention, a buffer circuit that relays data from one bus line to another is applied to the present invention. That is, a first bus line (32) is precharged to a predetermined precharge voltage during the precharge period before data is output from an output circuit (31 in FIG. 6) to the first bus line (32). The amplitude of a signal output to the first bus line (32) is determined by the precharge voltage and the power supply voltage of one of first and second power supplies driving the output circuit and/or receiver circuit. A receiver circuit (also termed "precharge+receiver circuit") (30) that precharges the first bus line (32) and receives data comprises a first transistor (NM301) inserted between the precharge power supply terminal (Vp2) and the first bus line (32) to precharge the first bus line (32); and a first inverter (INV301) which receives the precharge power supply voltage (Vp2) as the high-potential power supply voltage, which receives the inverted signal ($\overline{PE1}$) of a first precharge control signal (PE1) controlling the precharge operation, and whose output terminal is connected to the gate of the first transistor (NM301). The receiver circuit further comprises two transistors (PM301 and PM302), which are connected in parallel with one of their ends (sources) tied together to the high-potential power supply (VDD); and a transistor (NM302) which is connected between the other ends (drain), which are tied together, of the two transistors (PM301 and PM302) and the bus line (11) and whose control terminal is connected to the precharge power supply terminal (Vp2). The transistor (PM301) is turned on when the first precharge control signal (PE1) is active, and is turned off when the first precharge control signal (PE1) is inactive. The receiver circuit further comprises an inverter (INV302) whose input terminal is connected to the common connection point of the three transistors (PM301, PM302 and NM302). The control terminal of the transistor (PM302) is connected to the output terminal of the inverter (INV302). The receiver circuit further comprises an output circuit comprising a transistor (NM303) whose input terminal is connected to the output terminal of the inverter (INV302) and whose output terminal is connected to a second bus line (33). The second bus line (33) is precharged by a precharge circuit (34). After precharging, a signal output to the second bus line (33) by the output circuit (NM303) of the receiver circuit (30) is received by a receiver circuit (35) connected to the second bus line (33).

To describe the above-described embodiments of present invention more in detail, some examples of the present invention will be described with reference to the drawings. FIG. 1 is a diagram showing the configuration of an embodiment of the present invention. FIG. 1 schematically shows an example of the configuration of a memory device with a plurality of sub-arrays.

A plurality of memory cell sub-array blocks $10_l$–$10_m$ are all connected to a bus line 11. Referring to FIG. 1, the sub-array blocks $10_l$–$10_m$ each have the same configuration. For simplicity, FIG. 1 shows the configuration of one sub-array block 101.

A receiver circuit 13 is connected to the bus line 11. Data read from a memory cell selected in the sub-array block is output to the bus line 11 and is received by the receiver circuit 13, from which the data is output to an output terminal OUT.

A sub-array block $10_l$ comprises a memory cell array 101 in which a plurality of word lines and bit lines, not shown, are arranged in the row and column directions with memory cells, each at the intersection of a bit line and a word line, arranged as an array; a word driver 102 driving a word line selected by an X decoder, not shown, that receives an address signal; and a Y switch 103 turning on a switch connected to a bit line selected by a Y decoder, not shown, that receives an address signal and connecting the bit to a sense amplifier. Each bit line is composed of a pair of two complementary lines (T and B). A bit line pair (T and B) selected by the Y switch 103 is sent to a sense amplifier 104.

When the sense enable signal SE is activated, the sense amplifier 104 performs the sense operation and outputs the sense result SAB to an output circuit 110.

The output circuit 110 has an NMOS transistor 106, which works as an output stage transistor, with the drain connected to the bus line 11 and with the source connected to the low-potential power supply VSS. To the gate of the NMOS transistor 106 is connected the output terminal of a NOR circuit 105 that executes the logical NOR operation on the inverted signal of the sense enable signal SE and the SAB signal (inverted signal of output signal SAT of the sense amplifier 104) that is the output signal of the sense amplifier 104. The NOR circuit 105, which receives the output signal SAB from the sense amplifier 104 to turn on/off the NMOS transistor 106, constitutes an output control circuit.

When the sense enable signal SE is at a high level and the output signal SAB from the sense amplifier 104 is at a low level (output signal SAT from the sense amplifier 104 is at a high level), the output of the NOR circuit 105 goes to a high level and the NMOS transistor 106 is turned on to discharge the bus line 11.

In this embodiment, it is easily understood that the AND circuit, which receives the output signal SAT of the sense amplifier 104 and the sense enable signal SE and executes the logical AND operation on them, may be used instead of the NOR circuit 105.

A precharge circuit 12 connected to the bus line 11 comprises a precharge power supply circuit 121 and a transistor 122. The precharge power supply circuit 121 generates a precharge voltage that is an intermediate voltage between the high-potential power supply voltage VDD an d the low-potential power supply voltage VSS. The transistor 122, connected between the precharge power supply circuit 121 and the bus line 11, receives the precharge control signal PE at its gate to control the precharge operation and, when the precharge control signal PE is active, precharges the bus line 11 to the precharge voltage.

The receiver circuit 13, connected to the bus line 11, receives the control signal PE. When the precharge control signal PE is active, the receiver circuit 13 stops the reception operation; when the precharge control signal PE is inactive, the receiver circuit 13 executes the reception operation to output the received binary logical signal to the output terminal OUT. Because the driver driving the bus line 11 is composed only of the output-stage transistor 106 in this embodiment, the load capacity of the bus may be reduced as compared with that of the conventional driver circuit composed of a PMOS transistor and a NMOS transistor. In addition, in this embodiment, the driver driving the bus line 11 has a size smaller than that of the conventional driver.

Figure 2:
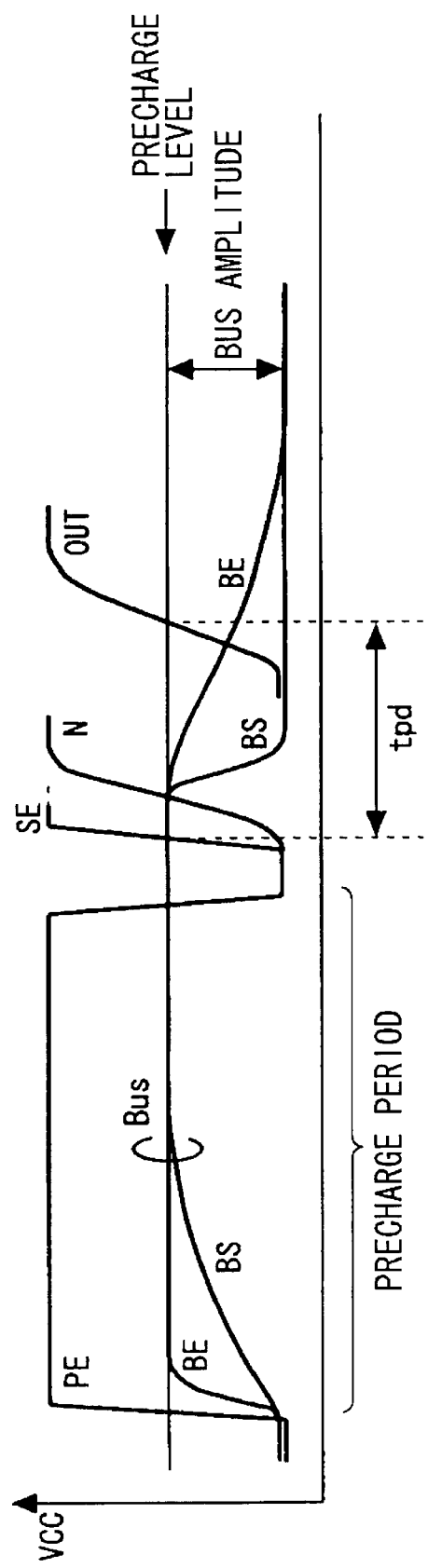
FIG. 2 is a diagram showing the waveform with respect to time for one embodiment of the present invention.

FIG. 2 is a diagram showing an example of timing waveforms of the configuration of this embodiment shown in FIG. 1. Referring to FIG. 2, PE indicates the precharge control signal shown in FIG. 1, SE indicates the sense enable signal shown in FIG. 1, N indicates the voltage waveform of the gate of the NMOS transistor 106 shown in FIG. 1 (output voltage waveform of NOR circuit 105), BS indicates the voltage waveform of the bus line 11 near the output buffer circuit 106 shown in FIG. 1, BE indicates the voltage waveform of the bus line 11 near the input terminal of the receiver circuit 13 that is at the far-end of the output buffer circuit 106 shown in FIG. 1, and OUT indicates the waveform of the output signal of the receiver circuit 13 shown in FIG. 1.

When the precharge control signal PE goes from a low level to a high level, the transistor 122 of the precharge circuit 12 is turned on and the bus line 11 is charged to the precharged voltage. The precharge control signal PE, generated and output by a bus control circuit not shown, is held high during the predetermined precharge period at the start of the data read cycle (read cycle). When the precharge period ends, the precharge control signal PE is set to a low level.

Next, the sense enable signal SE goes to a high level, the output signal SAT of the sense amplifier 104 goes to a high level (SAB is low), and the gate voltage of the NMOS transistor 106 is set to a high level. Then, the NMOS transistor 106 is turned on to discharge the bus line 11. The bus line 11 falls from the precharge potential to the low-potential power supply voltage VSS.

The precharge voltage is, for example, about the half of the high-potential power supply voltage VDD. In this case, the amplitude of the signal transmitted though the bus line 11 is VDD/2, with the result that the fall time at the far-end of the bus line 11 is reduced as compared with that in the configuration shown in FIG. 7.

The receiver circuit 13 compares the voltage of the bus line 11 connected to the input terminal with the reference voltage and outputs a signal whose logic amplitude is determined by the high-potential power supply voltage VDD and the low-potential power supply voltage VSS.

Figure 8:
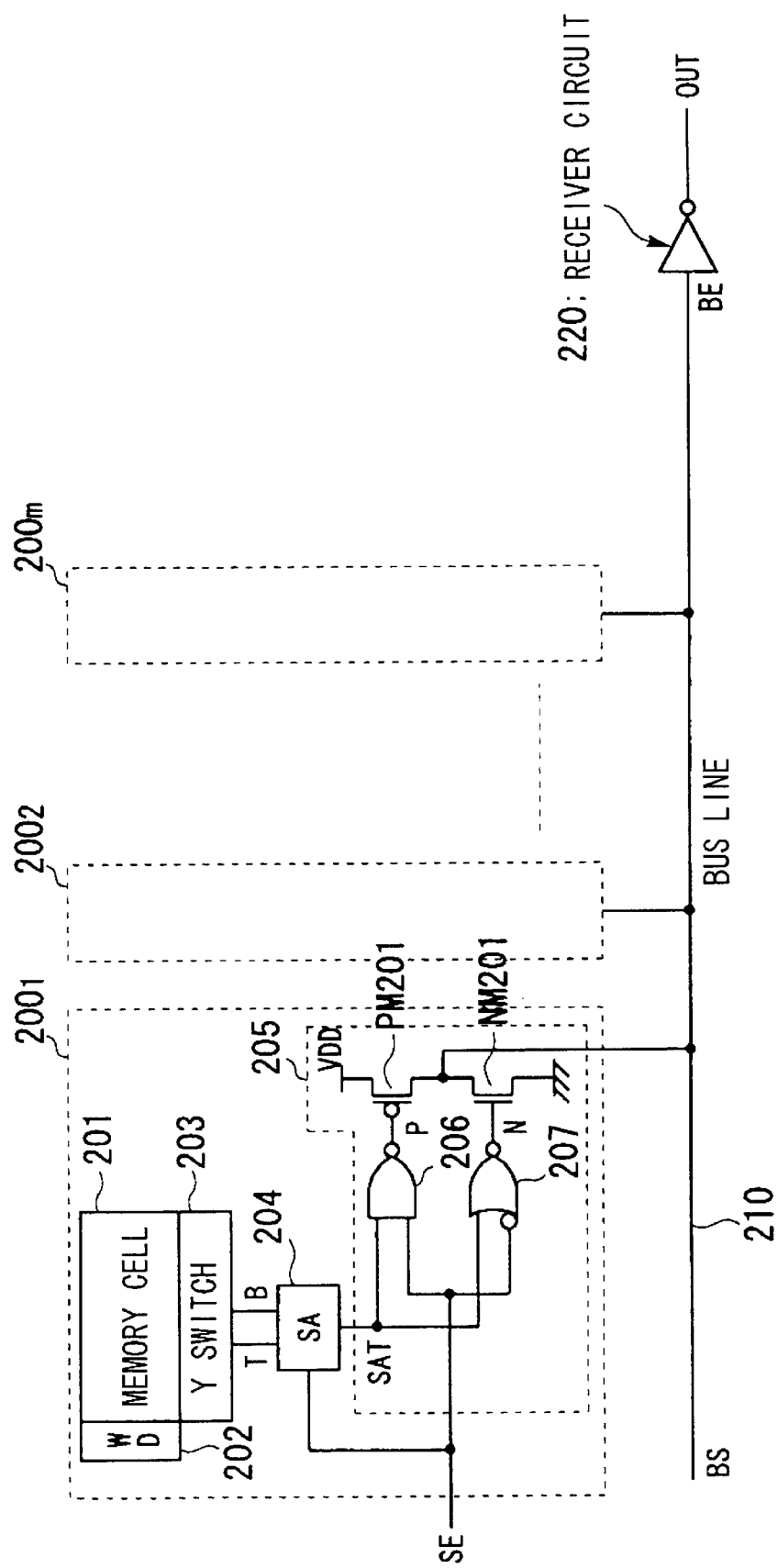
FIG. 8 is a diagram showing an example of the configuration of a conventional memory device.
Figure 9:
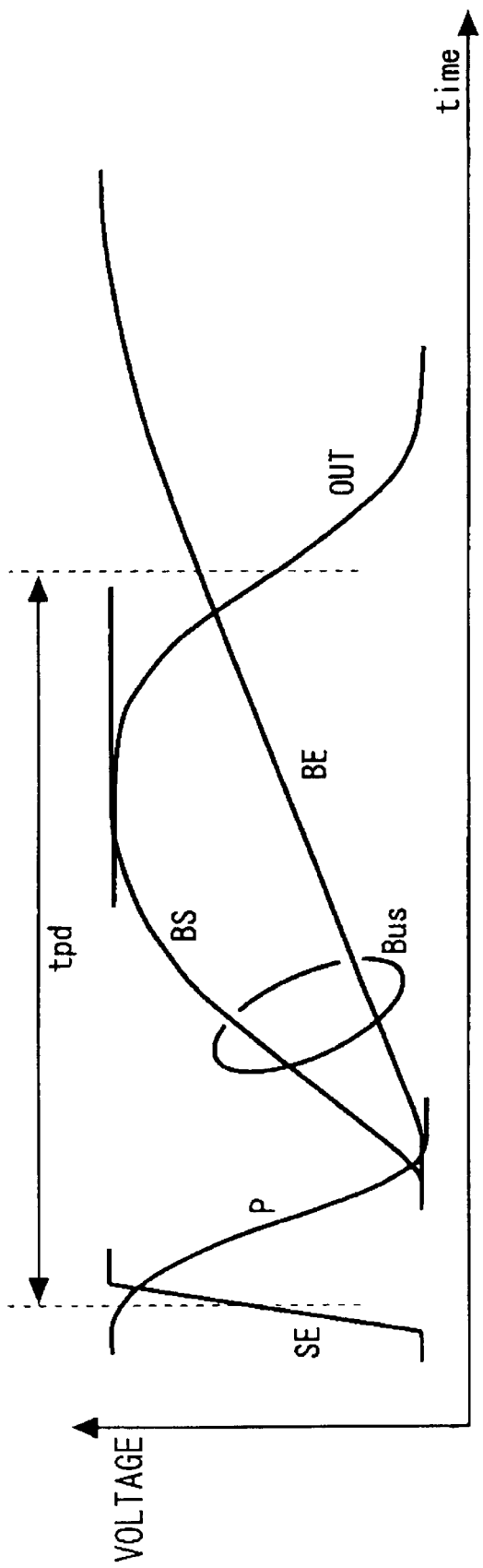
FIG. 9 is a diagram showing the waveform with respect to time for the circuit in FIG. 8.

In this embodiment, the delay time from the rise of the sense enable signal SE to the rise of the output signal OUT of the receiver circuit 13 is significantly reduced as compared with that of the conventional configuration shown in FIG. 8 and FIG. 9 and, as a result, the access time is reduced.

When the output circuit 110 driving the bus line 11 executes the output operation, the precharge control signal PE to be supplied to the precharge circuit 12 is set low to turn off the transistor 122. Also, when the receiver circuit 1 3 reads data from the bus line 11, the precharge circuit 12 stops the precharge operation of the bus line 11.

In the data read cycle of a memory device, an address signal supplied from outside the memory device is read and decoded, a memory cell is selected based on the decoded result and, from the bit line connected to the selected memory cell, the signal is read by the sense amplifier. The precharge operation on the bus line 11 (precharge period shown in FIG. 2) should be done any time after the cycle is started and before the read operation is executed by the sense amplifier.

In this embodiment, the receiver circuit 13 connected to the bus line 11 to receive a signal transmitted over the bus line 11 uses the reference voltage Vr, which is lower than the precharge voltage, to judge the logic of the received signal.

Figure 3:
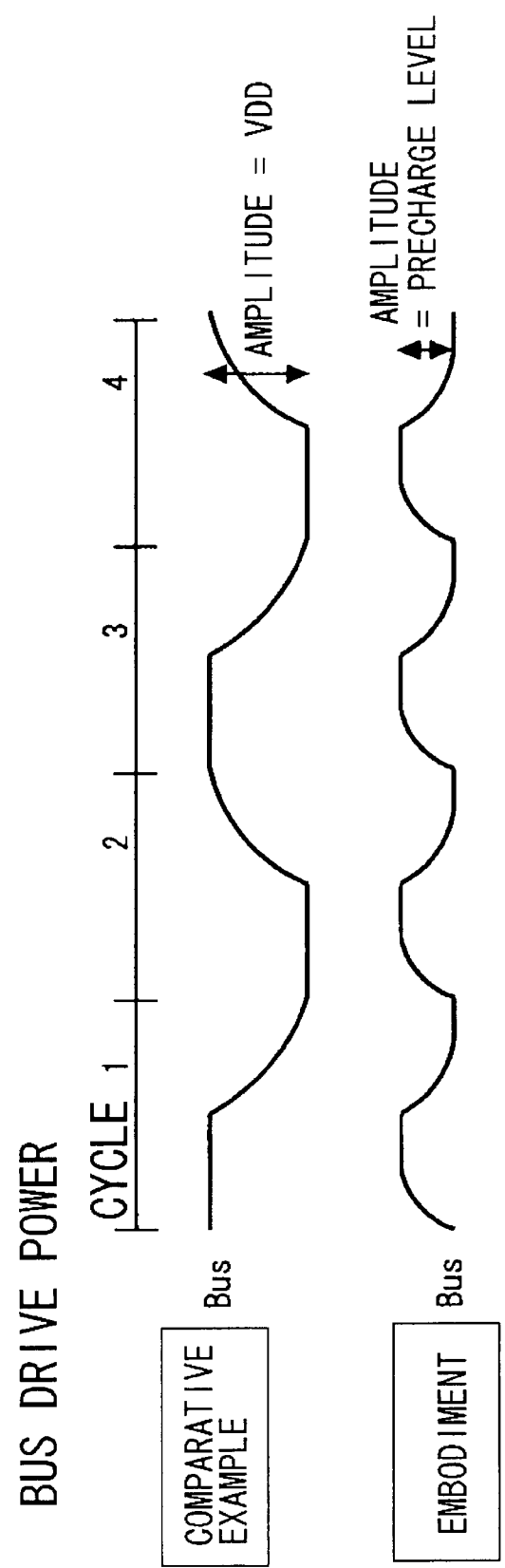
FIG. 3 is a diagram showing the voltage waveform of the embodiment of the present invention and that of a comparative example.

FIG. 3 is a diagram showing the comparison between the operation of the conventional bus system shown in FIG. 8 for comparison and the operation of the bus system according to the present invention. In the conventional system shown in FIG. 8 for comparison, the amplitude of the signal sent to the bus line is high-potential power supply voltage VDD and the low-potential power supply voltage VSS (ground potential). This means that the logical signals composed of low-potential power supply voltage VSS, high-potential power supply voltage VDD, . . . , are output in each read cycle according to the read values "1" and "0".

On the other hand, the amplitude of signals sent to the bus line 11 is determined in this embodiment by the precharge voltage and the low-potential power supply voltage VSS. At the start of each read cycle, the bus line is once precharged. When the read data is "1", the bus line 11 is set to low-potential power supply voltage VSS; when the read data is "0", the bus line 11 remains at the precharge voltage. Therefore, in this embodiment, the amplitude of the signal of the bus line 11 is smaller, and, because the driver driving the bus line 11 is composed of the NMOS transistor 106 only, the bus load capacity becomes smaller as compared with that of the conventional driver circuit composed of the PMOS transistor and the NMOS transistor (see FIG. 8). This reduces the peak current when the bus line 11 is driven and, as a result, the noise in the chip is reduced.

In general, in a circuit other than the bus line, for example, in an output driver circuit (driver circuit) that outputs data to a circuit external to the chip, the worst case of the current peak (power supply current at switching time) occurs when "0" and "1" are output alternately, for example, when the read data is "0"→"1"→"0"→"1". When the read data alternates between "0" and "1" in the conventional circuit configuration shown in FIG. 8, data on the bus line 210 also changes each cycle as described above. Therefore, in the whole chip (including sub-array block, sense amplifier, output circuit, bus line, and receiver circuit), noises (power supply noises at switching time) are generated by the current added up when data is switched.

On the other hand, in this embodiment, the worst case of the current (noise) of the bus line 11 occurs when the read data is "1"→"1"→"1"→"1"→. This means that this embodiment has a configuration different from that of the conventional circuit in the combination of data that results in the worst case of the current peak of the bus line 11. That is, in this embodiment, the combination of the worst-case data ("1"→"1"→"1"→"1") on the current of the bus line 11 differs from the combination of the worst-case data ("0"→"1"→"0"→"1") on the switching current of the other logical circuits included in the same chip as that of the bus line 11. Thus, in the whole chip, the current peak is distributed between the bus line 11 and the other circuits. This embodiment therefore reduces the peak current, thus reducing noises generated when the current reaches the peak.

Another advantage of this embodiment is that, when the precharge voltage of the bus line 11 is set to the half of the power supply voltage VDD, the signal amplitude of the bus line 11 becomes the half of the power supply voltage VDD. As compared with the conventional configuration in which the amplitude is VDD, the power consumption at switching operation time is reduced.

Figure 4:
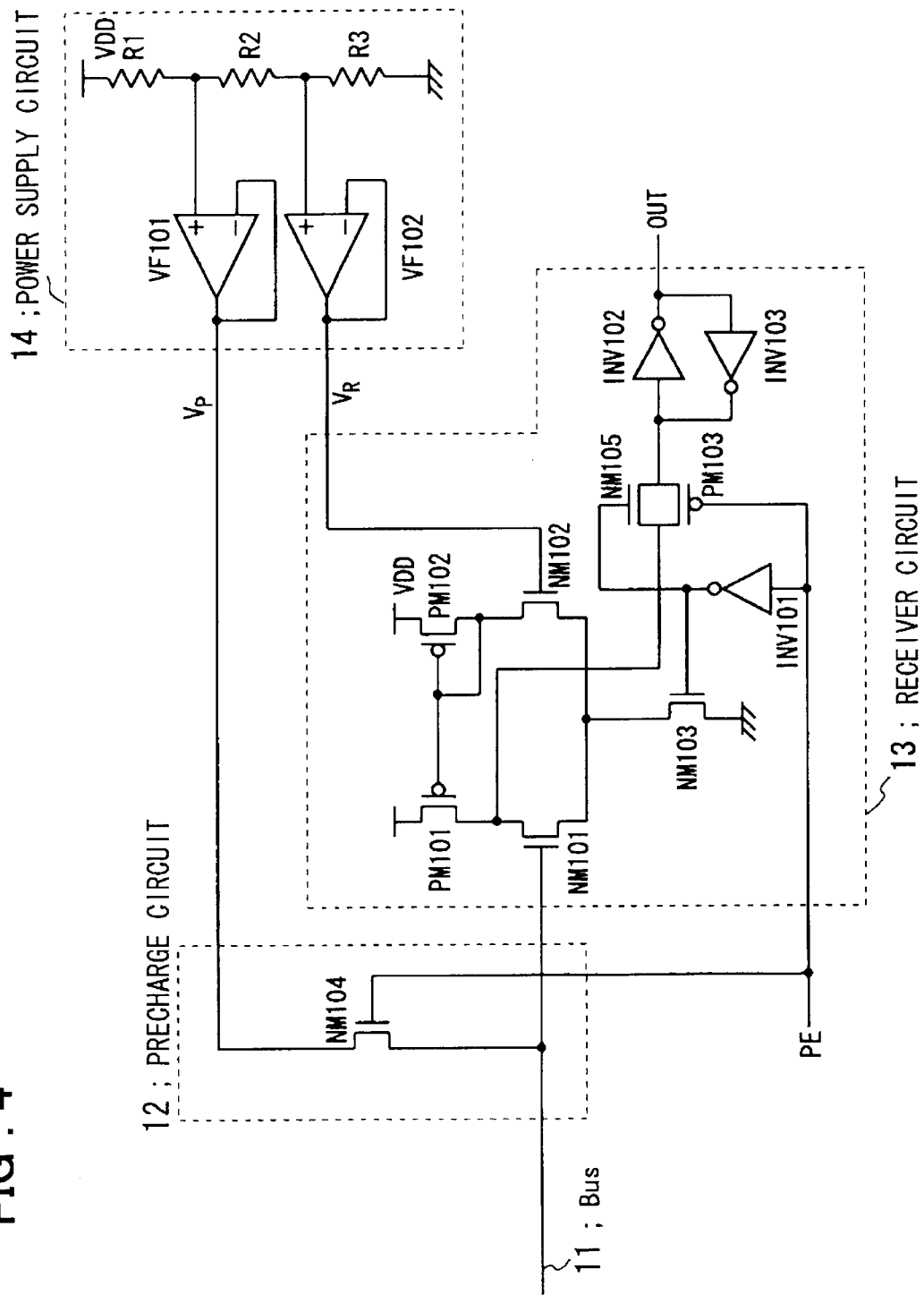
FIG. 4 is a diagram showing the configuration of a precharge circuit and a receiver circuit in one embodiment of the present invention.

Next, another embodiment of the present invention will be described. FIG. 4 is a diagram showing the configuration of a receiver circuit and a precharge circuit connected to the bus line 11 shown in FIG. 1.

Referring to FIG. 4, a circuit that supplies the reference voltage to the precharge power supply circuit 121 and the receiver circuit 13 in FIG. 1 is built as a power supply circuit 14 in this embodiment. The precharge circuit 12 is configured by an NMOS transistor NM104 whose drain is connected to the precharge voltage output terminal of the power supply circuit 14, whose gate receives the precharge control signal PE, and whose source is connected to the bus line 11.

A receiver circuit 13 comprises NMOS transistors NM101 and NM102, which compose a differential pair, and whose sources are coupled in common and are connected to the drain of an NMOS transistor NM103 that is a constant current source; and PMOS transistors PM101 and PM102, which compose a current mirror circuit that functions as an active load, and which are connected between the NMOS transistors NM101 and NM102, and the power supply VDD.

The source of the NMOS transistor NM103, which is the constant current source, is connected to the low-potential power supply voltage VSS, and the gate receives the signal generated by inverting the precharge control signal PE by an inverter INV101.

The connection point between the drain of the NMOS transistor NM101 of the differential pair and the drain of the PMOS transistor PM101, which is the load, is the output node of the differential circuit. The signal from this connection point is input to the input terminal of an inverter IN102, which is an inversion buffer circuit, via a CMOS transfer gate comprising the PMOS transistor PM103 whose gate receives the precharge control signal PE and an NMOS transistor NM105 whose gate receives the inverted signal ($\overline{PE}$) of the precharge control signal PE. The output terminal of the inverter INV102 is connected to an output terminal OUT of the receiver circuit 13. The output terminal of the inverter INV102 is connected to the input terminal of an inverter INV103, and the output terminal of the inverter INV103 is connected to the input terminal of the inverter INV102. The inverter INV102 and the inverter INV103 compose a flip-flop. When the transfer gate (NM105, PM103) is off, the input terminal of the inverter INV102 is set to the logic level immediately before the transfer gate enters the off state. The current drive capacity of the inverter INV103, which drives the input capacity of the inverter INV102, may be smaller than that of the inverter INV102.

The power supply circuit 14 comprises resistors R1, R2, and R3 connected in series between the high-potential power supply voltage VDD and the low-potential power supply voltage VSS; a first voltage follower VF101 composed of an operational amplifier (OP amp) in which the connection point between the resistors R1 and R2 is connected to the non-inversion input terminal (+) and in which the output terminal is connected to the inversion input terminal (−); and a second voltage follower VF102 in which the connection point between the resistors R2 and R3 is connected to the non-inversion input terminal (+) and in which the output terminal is connected to the inversion input terminal (−). The first voltage follower VF101 and the second voltage follower VF102 output the precharge voltage Vp and the reference voltage Vr, given by the following expressions, respectively from their output terminals.

$Vp=VDD \times (R2+R3)/(R1+R2+R3)$ $Vr=VDD \times R3/(R1+R2+R3)$

With reference to FIG. 4, the operation of this embodiment will be described. Data is output from an output circuit, not shown, to the bus line 11 precharged by the precharge circuit 12 to a precharge voltage Vp2. The differential circuit (including a differential pair of NM101 and NM102) compares the voltage of the bus line 11 with the reference voltage Vr. When the voltage of the bus line 11 is the precharge voltage Vp (the output SAT of the sense amplifier 104 in FIG. 1 is at a low level), the voltage is higher than the reference voltage Vr and, therefore, the signal output from the differential circuit (voltage of the drain node of the NMOS transistor NM101) is low. This signal is transferred to the buffer circuit INV102 via the transfer gate that is on (The precharge control signal PE is at a low level during data read operation), and the high-level signal is output from the buffer circuit INV102 to the output terminal OUT.

On the other hand, when the voltage of the bus line 11 is the low-potential power supply voltage VSS (the output SAT of the sense amplifier 104 in FIG. 1 is at a high level), the voltage is lower than the reference voltage Vr and, therefore, the signal output from the differential circuit is high. This signal is transferred to the buffer circuit INV102 via the transfer gate that is on (The precharge control signal PE is at a low level during data read operation), and the low level is output from the buffer circuit INV102 to the output terminal OUT.

In the circuit configuration shown in FIG. 4, the power supply circuit 14 is shared by the precharge circuit 12 and the receiver circuit 13. In addition, one power supply circuit 14 may also be provided on one chip.

In the configuration shown in FIG. 4, the receiver circuit 13 comprises the differential amplifier circuit where the DC current flows from the power supply voltage VDD to VSS. The propagation delay time of the receiver circuit 13 is not so short.

Figure 5:
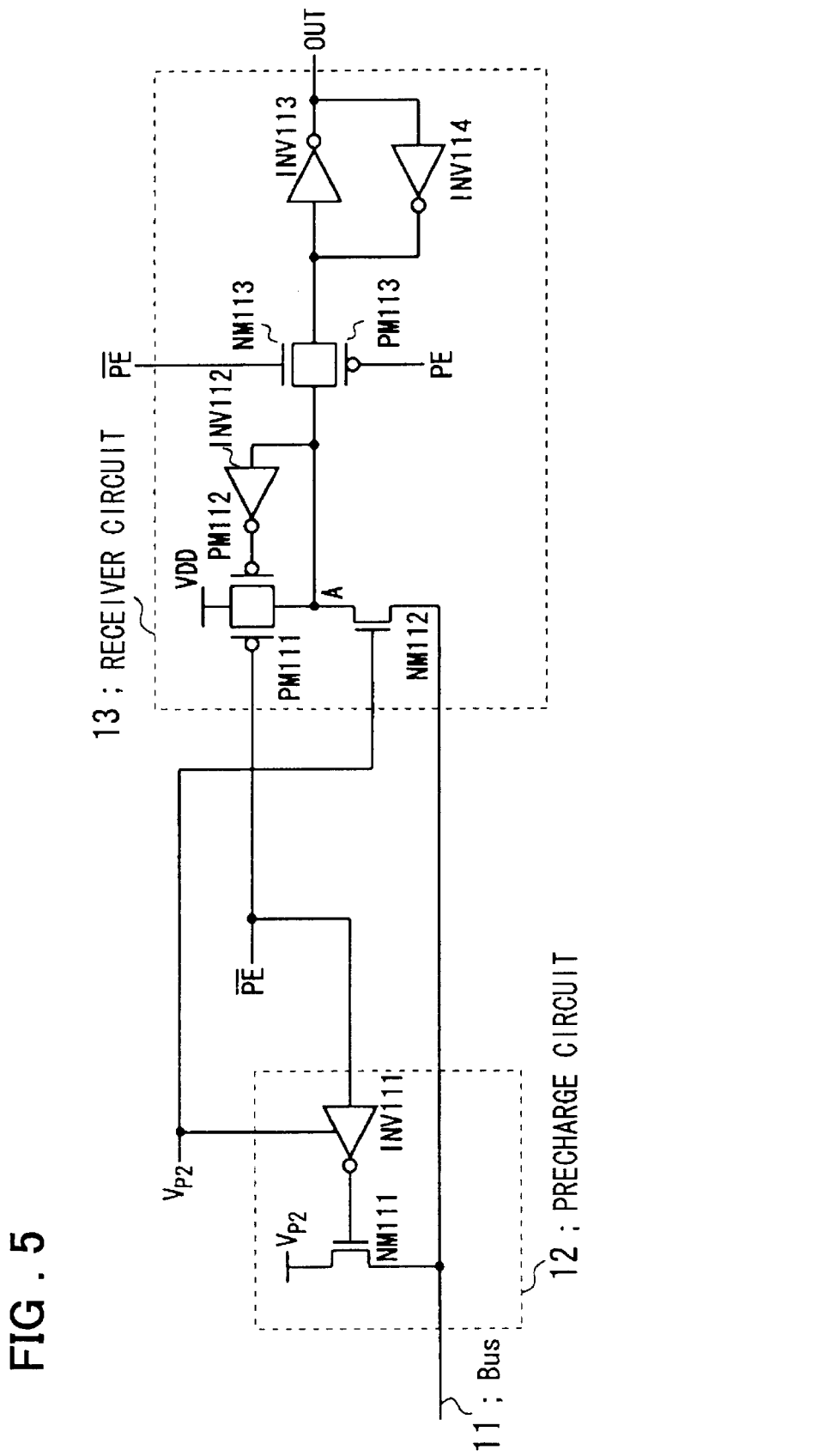
FIG. 5 is a diagram showing the configuration of a precharge circuit and a receiver circuit in another embodiment of the present invention.

FIG. 5 is a diagram showing the configuration of a receiver circuit in still another embodiment of the present invention. In FIG. 5, a precharge voltage Vp2 is the power supply that determines the precharge voltage of a bus line 11. The power supply voltage is higher than the low-potential power supply voltage VSS but lower than the high-potential power supply voltage VDD.

A precharge circuit 12 comprises an NMOS transistor NM111 whose drain is connected to the precharge power supply Vp2 and whose source is connected to the bus line 11; and an inverter INV111 that receives the inverted signal ($\overline{PE}$) of the precharge control signal PE and that is driven by the precharge power supply Vp2 and the low-potential power supply voltage VSS. The output terminal of the inverter INV111 is connected to the gate of the transistor NM111.

A receiver circuit 13 comprises an NMOS transistor NM112 whose source is connected to the bus line 11 and whose gate is connected to the precharge voltage Vp2; a PMOS transistor PM111 whose source is connected to the high-potential power supply VDD, whose drain is connected to the drain of the NMOS transistor NM112, and whose gate receives the inverted signal ($\overline{PE}$) of the precharge control signal PE; a PMOS transistor PM112 whose source is connected to the high-potential power supply VDD and whose drain is connected to the drain of the NMOS transistor NM112; and an inverter INV112 whose input terminal is connected to the drain (node A) of the NMOS transistor NM112. The output terminal of an inverter INV112 is connected to the gate of the PMOS transistor PM112. The drain (node A) of the NMOS transistor NM112 is connected to the input terminal of an inverter INV113, which is an inversion buffer, via a CMOS transfer gate. This transfer gate is composed of an NMOS transistor NM113 whose gate receives the inverted signal ($\overline{PE}$) of the precharge control signal PE and a PMOS transistor PM113 whose gate receives the precharge control signal PE. The output terminal of the inverter INV113 is connected to the output terminal OUT. The output terminal of the inverter INV113 is connected also to the input terminal of an inverter INV114, the output terminal of the inverter INV114 is connected to the input terminal of the inverter INV113, and the inverter INV113 and the inverter INV114 form a flip-flop. When the transfer gate (PM113, NM113) is off, the inverter INV114 sets the input terminal of the inverter INVI13 to the logic level immediately before the transfer gate becomes off. The current drive capacity of the inverter INV114 that drives the input capacity of the inverter INV113 may be smaller than that of the inverter INV113.

In the precharge circuit 12, when the precharge control signal PE is at a high level, the output of the inverter INV111 that receives the inverted signal ($\overline{PE}$) of the precharge control signal PE goes to a high level(precharge power supply voltage Vp2) and the source voltage of the NMOS transistor NM111 becomes Vp2−Vtn, where Vtn is the threshold voltage of the NMOS transistor NM111.

By reducing the precharge power supply voltage Vp2, the operation can be performed on the bus line 11 with a small amplitude. This increases the speed and reduces the power consumption.

In the receiver circuit 13, the gate-source voltage Vgs of the NMOS transistor NM112 is Vp2−(potential of bus line 11). If the bus line 11 is at the precharge voltage Vp=Vp2−Vtn, then Vgs=Vp2−(Vp2−Vtn)=Vtn, which equals the threshold voltage of the NMOS transistor.

The operation of the embodiment shown in FIG. 5 will be described. Because the precharge control signal PE is at a high level and the inverted signal ($\overline{PE}$) of the precharge control signal PE is at a low level during the precharge operation, the PMOS transistor PM111 whose gate receives the inverted signal ($\overline{PE}$) of the precharge control signal PE is turned on and the voltage of drain node A of the NMOS transistor NM112 becomes VDD. The output of the inverter INV112 falls to a low level, and the PMOS transistor PM112 is turned on.

When the precharge control signal PE is at a high level and its inverted signal ($\overline{PE}$) is at a low level, the transfer gate (NM113, PM113) is turned off and the output of the inverter INV113 (that is, the logic value stored in the flip-flop composed of the inverters INV113 and INV114) is output to the output terminal OUT.

Because the precharge control signal PE is at a high level and its inverted signal ($\overline{PE}$) is at a low level during the precharge operation, the PMOS transistor PM111 which receives the inverted signal $\overline{PE}$ of the precharge control signal PE at its gate is turned on.

Next, when the precharge operation ends, that is, when the precharge control signal PE is at a low level and its inverted signal ($\overline{PE}$) is at a high level, the NMOS transistor NM111 of the precharge circuit 12 is turned off and the PMOS transistor PM111 of the receiver circuit 13 is turned off. The transfer gate (PM113, NM113) of the receiver circuit 13 is turned on.

If, after the precharge circuit 12 precharges the bus line 11 in FIG. 1 (at this time, the precharge control signal PE is at a low level), the sense enable signal SE is at a high level and the output signal SAB of the sense amplifier 104 is at a low level (the output signal SAT of the sense amplifier 104 is at a high level), the gate-source voltage Vgs of the NMOS transistor NM112 becomes Vp2−(low-potential power supply voltage VSS) and the NMOS transistor NM112 is turned on to discharge node A when the bus line 11 is driven by the output circuit 110 to decrease its voltage from the precharge voltage to the low-potential power supply voltage VSS. When node A has discharged, the output voltage of the inverter INV112 goes to a high level to turn off the P channel MOS transistor PM112. The voltage of node A (being at a low level) is sent via the transfer gate (NM113, PM113) to the input terminal of the inverter INV113, which comprises an inversion buffer, and the high-level signal is output from the inverter INV113 to the output terminal.

When the precharge control signal PE is set to a low level, the sense enable signal SE is at a high level, and the output signal SAB of the sense amplifier 104 in FIG. 1 is at a high level(output signal SAT of the sense amplifier 104 is at a low level), the bus line 11 remains at the precharge voltage and node A of the receiver circuit 13 remains at the high-potential power supply voltage VDD. The voltage of node A is transmitted to the input terminal of the inverter INV113, which is an inversion buffer, via the transfer gate (NM113, PM113). The inverted signal of node A, which is low, is output to the output terminal OUT. At this time, the inverter INV112 outputs the low level signal to the gate of the PMOS transistor PM112, the PMOS transistor PM112 is turned on, and node A is held at the high-potential power supply voltage VDD.

The inverter INV114 supplies the signal, generated by inverting the value of the output terminal OUT, to the input terminal of the inverter INV113. When the transfer gate (NM113, PM113) is off (precharge operation time during which the precharge control signal PE is at a high level), the signal voltage generated by inverting the value of the output terminal OUT immediately before the transfer gate is turned off is supplied to the input terminal of the inverter INV113. That is, during the precharge operation time when the precharge control signal PE is at a high level, the data that was output to the bus line 11 in the previous cycle is held in, and output from, the flip-flop composed of the inverters INV113 and INV114. When the precharge control signal PE is at a low level, the signal (voltage at node A) generated by converting the level of data output to the bus line 11 is held in, and output from, the flip-flop (inverters INV113 and INV114) via the transfer gate (NM113, NM114) that is on.

In this embodiment, the DC current does not flow from the power supply VDD to VSS as in the differential circuit shown in FIG. 4 except when the NMOS transistor NM112, which works with the PMOS transistors PM111 and PM112 to determine the voltage level of the bus line 11 in the receiver circuit 13, is turned on. This configuration reduces power consumption and performs high-speed operation because the signal logic of the bus line 11 is determined based on the voltage at node A that is set to the high-potential power supply voltage VDD.

Figure 6:
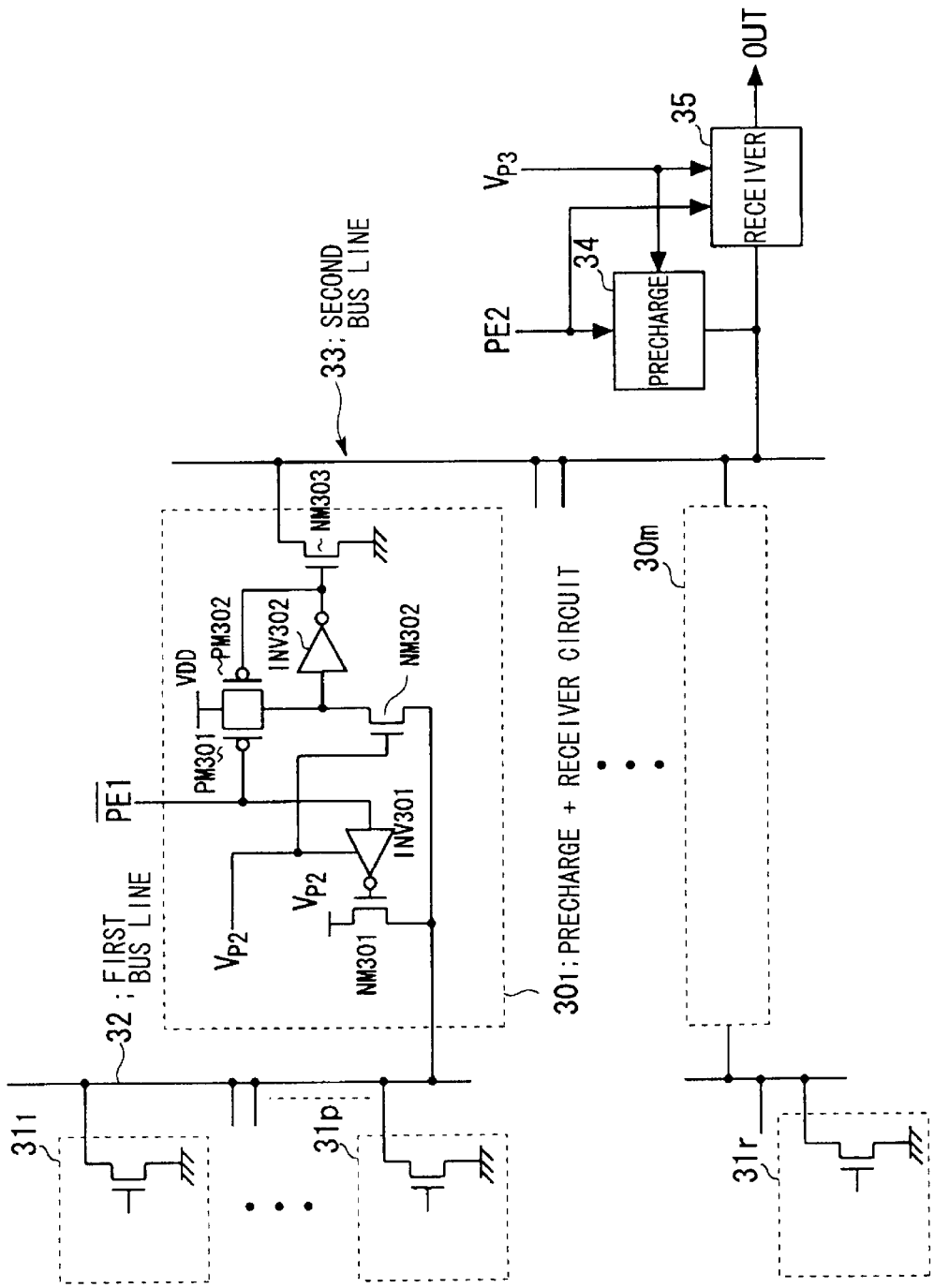
FIG. 6 is a diagram showing still another embodiment of the present invention.

Next, a still another embodiment of the present invention will be described. FIG. 6 is a diagram showing the configuration of a still another embodiment of the present invention. The figure shows the configuration of a receiver buffer circuit connected between buses.

Referring to FIG. 6, a first bus line 32 and a second bus line 33 are precharged to the precharge voltage Vp, about half of the power supply voltage VDD, as described in the above embodiments. The amplitude of the signal flowing through those bus lines is the amplitude of the precharge voltage.

To the first bus line 32, output circuits $31_1$–$31_r$ are connected, each composed of an NMOS transistor (output stage transistor) whose drain is connected to the first bus line 32, whose source is connected to the low-potential power supply VSS, and which receives at its gate a signal to be output.

A receiver circuit (also called "precharge+receiver circuit") $30_l$ connected to the first bus line 32 receives a signal from the first bus line 32 and outputs it to the second bus line 33. A precharge circuit 34 and a receiver circuit 35 are connected to the second bus line 33.

The receiver circuit (precharge+receiver circuit) $30_l$ comprises a precharge circuit (see FIG. 5), a receiver circuit, and an open drain output circuit.

The embodiment will be described more in detail. Referring to FIG. 6, the precharge circuit comprises an NMOS transistor NM301 whose drain is connected to the power supply Vp2 and whose source is connected to the first bus line 32; and an inverter INV301 that receives the inverted signal ($\overline{PE1}$) of a first precharge control signal PE1 and is driven by the precharge voltage Vp2. The output terminal of the inverter INV301 is connected to the gate of the NMOS transistor NM301. The inverter INV301 and the NMOS transistor NM301 constitute the precharge circuit. The receiver circuit comprises an NMOS transistor NM302 whose source is connected to the first bus line 32 and whose gate receives the precharge power supply voltage Vp2; a PMOS transistor PM301 whose source is connected to the high-potential power supply VDD, whose drain is connected to the drain of the NMOS transistor NM302, and whose gate receives the inverted signal ($\overline{PE1}$) of the precharge control signal PE1; a PMOS transistor PM302 whose source is connected to the high-potential power supply VDD and whose drain is connected to the drain of the NMOS transistor NM302; and an inverter INV302 whose input terminal is connected to the drain of the NMOS transistor NM302. The output terminal of the inverter INV302 is connected to the gate of the PMOS transistor PM302. The output terminal of the inverter INV302 is connected also to the gate of an NMOS transistor NM303 whose drain is connected to the second bus line 33 and whose source is connected to the low-potential power supply voltage VSS. When the first precharge control signal PE1 is at a high level, the inverted signal ($\overline{PE1}$) of the first precharge control signal PE1 is at a low level. In this case, the PMOS transistor PM301 is turned on, the drain node of the NMOS transistor NM302 is connected to the high-potential power supply voltage VDD, the output signal of the inverter INV302 is set to a low level, and the NMOS transistor NM303 whose gate receives the output signal of the inverter INV302 is turned on. When the first precharge control signal PE1 is at a low level, the inverted signal ($\overline{PE1}$) of the first precharge control signal PE1 is at a high level. In this case, the PMOS transistor PM301 is turned off and, depending upon whether the voltage level of the first bus line 32 is the low-potential power supply voltage VSS or the first precharge voltage, the drain node of the NMOS transistor NM302 is set to low-potential power supply voltage VSS or to the high-potential power supply voltage VDD, the output signal of the inverter INV302 whose input terminal receives the drain node voltage of the NMOS transistor NM302 is set to a high level or a low level, and the NMOS transistor NM303 whose gate receives the output signal of the inverter INV302 is turned on or off.

A precharge circuit 34 and a receiver circuit 35 connected to the second bus line 33 are configured by the precharge circuit 12 and the receiver circuit in the embodiment described above with reference to FIG. 1 or FIG. 4. In the embodiment shown in FIG. 6, the precharge operation and the read operation of the precharge circuit 34 and the receiver circuit 35 are controlled by a second precharge control signal PE2. The precharge power supply used to precharge the second bus line 33 is a power supply Vp3 that is separate from Vp2. Of course, one power supply may be used for the precharge power supplies Vp3 and Vp2.

In the precharge circuit according to the present embodiment, the output of the inverter INV301, which receives the inverted signal ($\overline{PE1}$) of the first precharge control signal PE1, is at a high level (power supply voltage Vp2) when the first precharge control signal PE1 controlling the precharge of the first bus line 32 is at a high level and, as a result, the source voltage of the NMOS transistor NM301 becomes Vp2–Vtn, where the Vtn is the threshold voltage of the NMOS transistor NM301.

Setting the first precharge power supply voltage Vp2 to a low voltage allows the small-amplitude operation to be performed for the bus line, thus making it possible to increase the speed and to reduce the power consumption. Those advantages are the same as those in the embodiment described with reference to FIG. 5. It should be noted that setting the first precharge voltage Vp2 to the high-potential power supply voltage VDD eliminates the need for the power supply for the precharge voltage Vp2.

The gate-source voltage Vgs of the NMOS transistor NM302 becomes Vp2–(bus line potential). When the second bus line 33 is at the precharge voltage Vp=Vp2–Vtn, Vgs= Vp2–(Vp2–Vtn)=Vtn. This is equal to the threshold voltage of the NMOS transistor.

In the precharge period of the first bus line 32, the first precharge control signal PE1 is at a high level and its inverted signal ($\overline{PE1}$) is at a low level. Therefore, the PMOS transistor PM301 whose gate receives the inverted signal ($\overline{PE1}$) of the first precharge control signal PE1 is turned on, the drain node of the NMOS transistor NM302 is set to the high-potential power supply voltage VDD, the output of the inverter INV302 is set to a low level, and the PMOS transistor PM302 is also turned on. Because the output of the inverter INV302 is at a low level, the NMOS transistor NM303 whose gate receives the signal from the output terminal of the inverter INV302 is turned off. In this case, the NMOS transistor NM303 does not drive the second bus line 33. In the receiver circuit (pre-charger +receiver circuit) 301, the second bus line 33 is set to the predetermined precharge voltage by the precharge circuit 34 before the NMOS transistor NM303 drives the second bus line 33.

When the precharge period of the first bus line 32 ends, that is, when the precharge control signal PE1 is at a low level and its inverted signal ($\overline{PE1}$) is at a high level, the NMOS transistor NM301 is turned off and the PMOS transistor PM301 is turned off.

When the NMOS transistor of one of a plurality of output circuits 31 connected to the first bus line 32 is turned on and the first bus line 32 goes to a low level (low-potential power supply voltage VSS), the gate-source voltage Vgs of the NMOS transistor NM302 becomes Vp2−(low-potential power supply voltage VSS). Then, the NMOS transistor NM302 is turned on to discharge the drain node, the output voltage of the inverter INV302 goes to a high level, and the PMOS transistor PM302 is turned off. The voltage of the drain node of the NMOS transistor NM302 goes to a low level and is inverted by the inverter INV302. Then, the high-level voltage is fed to the gate of the NMOS transistor NM303, the NMOS transistor NM303 is turned on, and the second bus line 33 goes to a low level. The receiver circuit 35 receives the signal from the second bus line 33 and outputs the signal having the normal logic amplitude to the output terminal OUT.

Figure 7:
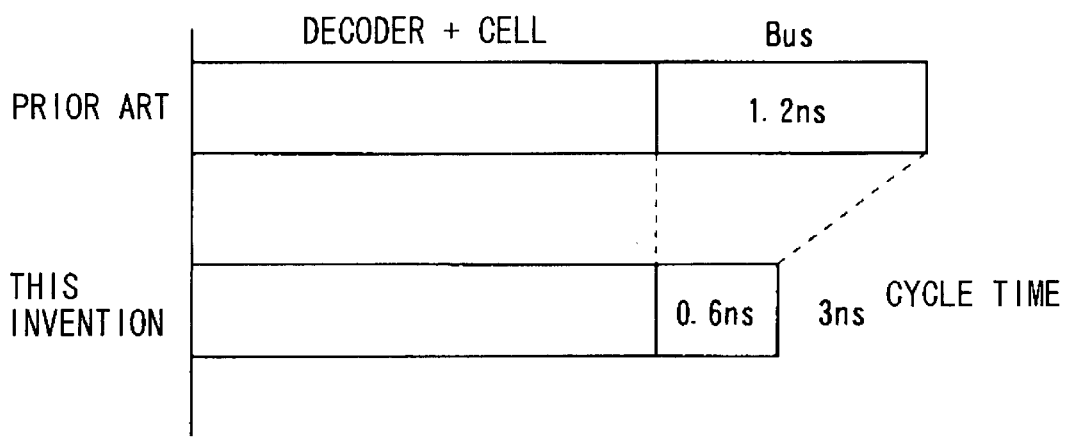
FIG. 7 is a diagram showing the comparison between the bus cycle time of the embodiment of the present invention and that of a comparative example (configuration in FIG. 7).

FIG. 7 is a diagram showing the performance comparison between the embodiment of the present invention with the conventional circuit shown in FIG. 8 which is provided as a comparative example. As shown in FIG. 7, the time required for the address decoder to decode an address during a read access operation plus the time required to access the selected cell (decoder+cell) is the same between the circuit according to the present invention and the comparative example (conventional circuit). On the other hand, the time required by the circuit according to the present invention from the moment the sense enable signal SE is activated to the moment the output signal OUT of the receiver circuit is output is about the half (0.6 ns) of that required by the conventional circuit. Thus, the circuit according to the present invention, if applied to a memory device, would contribute to an improvement in access time.

Figure 10:
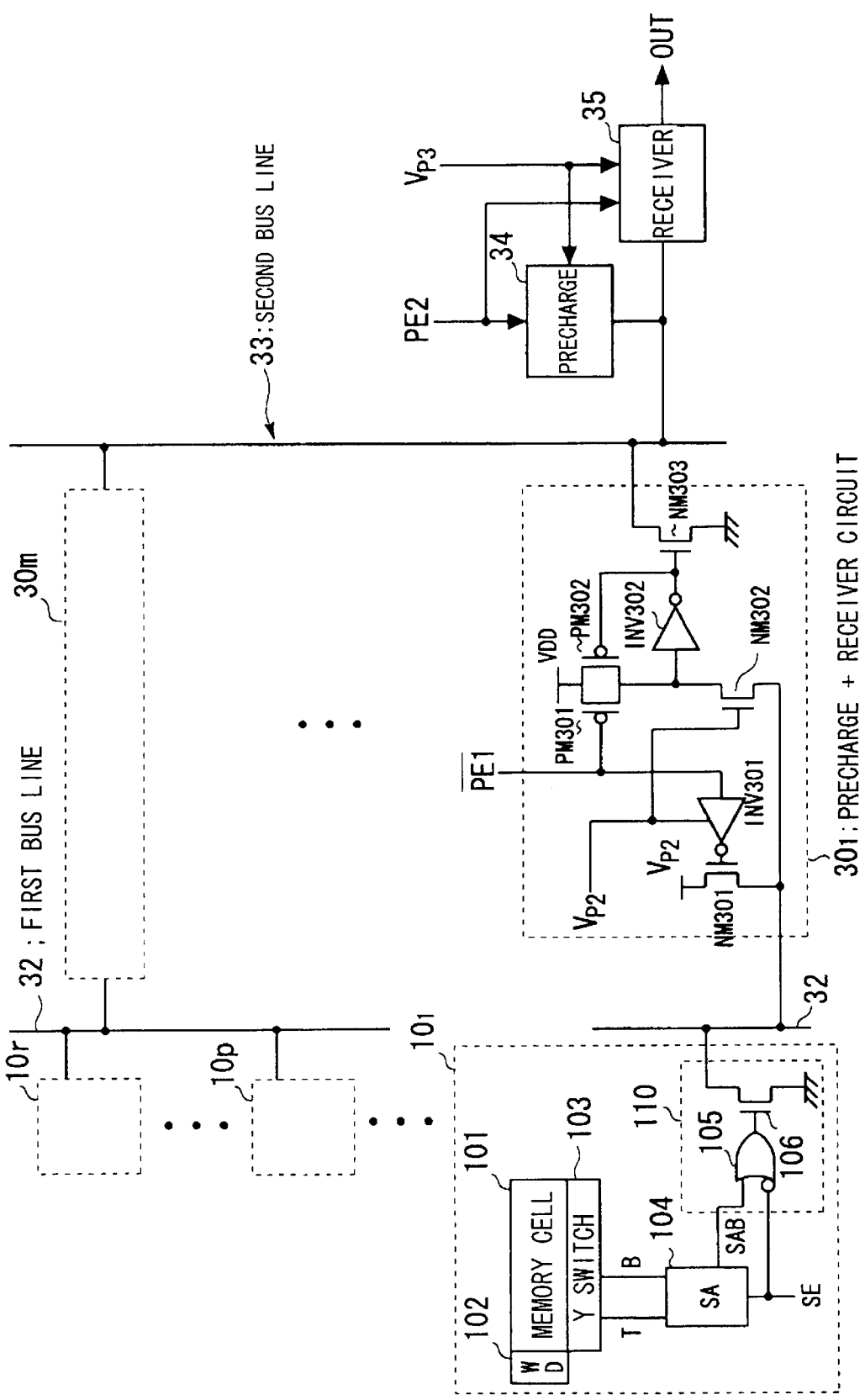
FIG. 10 is a diagram showing the configuration of a still another embodiment of the present invention.

Next, a still another embodiment of the present invention will be described. FIG. 10 is a diagram showing the configuration of a still another embodiment of the present invention. FIG. 10 shows the configuration of a semiconductor memory device comprising the sub array blocks 10 shown in FIG. 1 and the "precharge+receiver" circuit (simply called "receiver circuit") 30 connected between the first bus line 32 and the second bus line 33 shown in FIG. 6. Referring to FIG. 10, each of a plurality of sub-array blocks $10_1$–$10_r$ connected to the first bus line 32 via an output circuit 110 has the same configuration as that of the sub-array block $10_1$ in FIG. 1. In FIG. 10, only one sub-array block $10_1$ is shown for simplicity.

The sub-array block $10_1$ comprises a memory cell array 101 composed of a plurality of memory cells; a word driver 102 that drives a word line selected by an X decoder, not shown, that receives an address signal; and a Y switch 103 that turns on the switch connected to a bit line selected by the Y decoder, not shown, that receives an address signal and that connects the bit to a sense amplifier. Each bit line is composed of a pair of two complementary lines (T, B). A bit line pair (T, B) selected by the Y switch 103 is sent to a sense amplifier 104. When the sense enable signal SE is activated, the sense amplifier 104 performs the sense operation and outputs the sense result SAB to the output circuit 110. The output circuit 110 has an NMOS transistor 106, which is an output stage transistor, with the drain connected to the first bus line 32 and with the source connected to the low-potential power supply VSS. To the gate of the NMOS transistor 106 is connected the output terminal of a NOR circuit 105 that executes the logical NOR operation on the inverted signal of the sense enable signal SE and the SAB signal (inverted signal of output signal SAT of the sense amplifier 104) that is the output signal of the sense amplifier 104. The NOR circuit 105, which receives the output signal SAB of the sense amplifier 104 for turning on/off the NMOS transistor 106, constitutes an output control circuit.

When the sense enable signal SE is at a high level and the output signal SAB of the sense amplifier 104 is at a low level(output signal SAT of the sense amplifier 104 is high), the output of the NOR circuit 105 is set to a high level, the NMOS transistor 106 is turned on, and the first bus line 32 is discharged.

In FIG. 10, the configuration and the operation of a receiver circuit 30, are the same as those described above with reference to FIG. 6. The configuration of a precharge circuit 34 and a receiver circuit 35 connected to the second bus line 33 is also the same as that described above with reference to FIG. 6 and therefore they perform the same operation. The description is omitted here.

The following describes an example of the operation in which data is read from a memory cell in the sub-array block $10_1$. During the precharge period at the start of the read cycle in which data is read from a memory cell in the sub-array block $10_1$, a first precharge control signal PE1 goes high and, via an NMOS transistor NM301, the first bus line 32 is precharged to a first precharge voltage (Vp2−Vtn, where Vp2 is the first precharge power supply voltage and Vtn is the threshold voltage of the NMOS transistor NM301).

When the precharge period of the first bus line 32 is finished, the first precharge control signal PE1 is set to a low level and the sense enable signal SE is set to a high level. When the data signal SAT read from the activated sense amplifier 104 takes a logic value "1" (for example, corresponding to a high level), the complementary data signal SAB is at a low level. Therefore, the NOR circuit 105 outputs a high level signal, turns on the NMOS transistor 106, and sets the first bus line 32 to the level of the low-potential power supply voltage VSS. In the receiver circuit $30_1$ (precharge+receiver circuit), an NMOS transistor NM302, whose source receives the signal from the first bus line 32 that is at the level of the low-potential power supply voltage VSS (low level), is turned on. Thus, the drain node of the NMOS transistor NM302 goes to a low level, and the output of the inverter INV302, whose input terminal is connected to the drain node of the NMOS transistor NM302, is set to a high level. Therefore, the PMOS transistor PM302 which has a gate for receiving the output signal from the inverter INV302 is turned off. At this time, the PMOS transistor PM301 which has a gate for receiving the inverted signal of the first precharge control signal PE1 is turned off, and the drain node of the NMOS transistor NM302 goes to a low level. The NMOS transistor NM303 whose gate receives the output signal (high level) of the inverter INV302 is turned on, and the second bus line 33 is set to a low level. During the precharge period of the read operation in which data is read from the second bus line 33, the second bus line 33 is precharged to a second precharge voltage Vp3 via the precharge circuit 34 controlled by the second precharge control signal PE2. The precharge period of the first bus line 32 may be earlier than, or at the same time with, that of the second bus line 33. The receiver circuit 35, which may have the same configuration as that shown in FIG. 4, receives the low level signal from the second bus line 33 when the second precharge control signal PE2 is low and outputs the low-level signal from the output terminal OUT.

On the other hand, when the data signal SAT read from the activated sense amplifier 104 takes a logic value "0" (for example, corresponds to a low level) after the precharge period of the first bus line 32, the complementary data signal SAB is at a high level and the sense enable signal SE is at a high level (its inverted signal is at a low level). Therefore, the NOR circuit 105 outputs a low level signal, turns off the NMOS transistor 106, and holds the first bus line 32 at the first precharge voltage Vp2−Vtn. In the receiver circuit 30, (precharge+receiver circuit), the NMOS transistor NM302 whose source receives the signal from the first bus line 32 at the first precharge voltage level is turned off, the drain node of the NMOS transistor NM302 is set to a high level, and the output of the inverter INV302 whose input terminal is connected to the drain node of the NMOS transistor NM302 goes to a low level. Therefore, the PMOS transistor PM302 whose gate receives the output of the inverter INV302 is turned on, and the drain node of the NMOS transistor NM302 is set to a high level. The PMOS transistor PM301 whose gate receives the inverted signal of the first precharge control signal PE1 is turned off. The NMOS transistor NM303 whose gate receives the output signal (being a low level) of the inverter INV302 is turned off, and the second bus line 33 is set to the second precharge voltage Vp3. When the second precharge control signal PE2 is at a low level, the receiver circuit 35 receives the second precharge voltage Vp3 from the second bus line 33 and outputs a high level signal (high-potential power supply voltage VDD level) from the output terminal OUT.

Although the present invention has been described with reference to the preferred embodiments thereof, it will be understood that the present invention is not limited to those embodiments, and that various other changes and modifications may be made by those skilled in the art without departing from the scope or spirit of the invention.

The meritorious effects of the present invention are summarized as follows.

As described above, in the configuration according to the present invention, the bus line is precharged to a voltage lower than the power supply voltage and the output circuit that drives the bus line sets the bus line from the precharge voltage to a fixed voltage according to the logic value of a signal to be output. This configuration therefore increases the operation speed of the bus interface circuit and reduces power consumption.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A bus interface circuit comprising:
   a precharge circuit including a switch element inserted between a bus line and a precharge power supply terminal, said switch element controlled to be turned on and off based on a precharge control signal for controlling a precharge operation,
   said precharge circuit precharging said bus line to a predetermined precharge voltage via said switch element being turned on, from said precharge power supply terminal, during the precharge operation;
   an output circuit outputting an output signal to said bus line, a logic amplitude of said output signal being determined by the precharge voltage and a predetermined fixed voltage which is one of first and second power supply voltages; and
   a receiver circuit receiving a signal output from said output circuit to said bus line;
   wherein the precharge voltage is a predetermined voltage between two power supply voltages of said first and second power supplies for driving said receiver circuit and/or said output circuit.

2. The bus interface circuit according to claim 1, wherein said output circuit comprises means for driving said bus line being precharged to the precharge voltage to set the voltage of said bus line from the precharge voltage to the predetermined fixed voltage, when a signal to be output to said bus line is at a first logic level corresponding to said first power supply,
   said means controlling not to drive said bus line but to keep the voltage of said bus line at the precharge voltage, when a signal to be output to said bus line is at a second logic level corresponding to said second power supply.

3. The bus interface circuit according to claim 1, wherein the fixed voltage is a lower power supply voltage of the first and second power supplies and
   wherein said output circuit comprises an output-stage transistor being inserted between said bus line and the lower power supply, and having a control terminal for receiving a signal to be output to said bus line, said output-stage transistor being turned on for discharging said bus line to change the voltage of said bus line from the precharge voltage to the lower power supply voltage when the signal to be output to said bus line is at a first logic level.

4. The bus interface circuit according to claim 1, wherein said receiver circuit comprises means for receiving a signal from said bus line, a logic amplitude of said signal being determined by the precharge voltage and the fixed voltage, and for checking if the received signal is a logic level signal corresponding the first power supply voltage or a logic level signal corresponding to the second power supply voltage.

5. The bus interface circuit according to claim 4, wherein a reference voltage used to determine the logic level of the received signal in said receiver circuit is between the precharge voltage and the fixed voltage.

6. The bus interface circuit according to claim 1, further comprising a power supply circuit including:
   a plurality of resistors connected in series between said first power supply and said second power supply;
   first and second output terminals;
   a first driver circuit receiving a voltage from a connection point corresponding to the precharge voltage among connection points of said plurality of resistors for outputting the precharge voltage from said first output terminal; and a second driver circuit receiving a voltage from a connection point corresponding to said reference voltage among connection points of said plurality of resistors for outputting the reference voltage from said second output terminal;

wherein said precharge circuit includes:
a switch element being inserted between said first output terminal of said power supply circuit and said bus line, having a control terminal for receiving the precharge control signal, and being turned on, when the precharge control signal is active, to precharge said bus line according to the precharge voltage from said first output terminal, wherein said receiver circuit includes:
a differential circuit comprising:
a differential pair having a pair of inputs respectively connected to said bus line and said second output terminal of said power supply circuit;
a load element pair connected between an output pair of said differential pair and said first power supply; and
a current source for driving said differential pair, said current source being connected to said second power supply, and being controlled to be inactive during the precharge operation based on the precharge control signal;
a transfer gate having one end connected to an output terminal of said differential circuit, and having a control terminal for receiving the precharge control signal to be turned off during the precharge operation; and
a buffer circuit having an input terminal connected to another end of said transfer gate and having an output terminal connected to an output terminal of said receiver circuit.

7. The bus interface circuit according to claim 1, wherein said precharge circuit comprises:
a first transistor of first type conductivity inserted between the precharge power supply terminal and said bus line, said precharge power supply terminal determining the precharge voltage of said bus line; and
a first control circuit outputting an output signal with a voltage corresponding to the precharge power supply voltage when the precharge control signal is active and supplying the output signal to a control terminal of said first transistor, said first control circuit outputting the output signal based on the precharge control signal, with the precharge power supply being provided as a high-potential side drive power supply;
wherein, when the output signal of said first control circuit is at a voltage level corresponding to the precharge power supply voltage, said first transistor is turned on to precharge said bus line.

8. The bus interface circuit according to claim 7, wherein said first control circuit comprises a first inverter having an input terminal for receiving an inverted signal of the precharge control signal and an output terminal for outputting an inverted signal of the received signal, wherein the precharge power supply voltage is output as a signal at a logic level corresponding to the high-potential side power supply voltage.

9. The bus interface circuit according to claim 1, wherein said receiver circuit comprises:
second and third transistors of second type conductivity, connected in parallel with one of ends thereof tied together to said first power supply;

a fourth transistor of first type conductivity, connected between other ends, which are tied together, of said second and third transistors and said bus line and having a control terminal connected to said precharge power supply terminal, wherein said second transistor is controlled to be on and off respectively, when said precharge control signal is active and inactive;
a second inverter having an input terminal connected to a common connection node of said second to fourth transistors and having an output terminal connected to a control terminal of said third transistor;
a transfer gate having one end connected to the connection point of said second to fourth transistors, and being controlled to be off and on respectively when the precharge control signal is active and inactive; and
a buffer circuit having an input terminal connected to another end of said transfer gate and having an output terminal connected to an output terminal of said receiver circuit.

10. The bus interface circuit, according to claim 9, wherein said buffer circuit comprises:
a third inverter; and
a fourth inverter having an input terminal connected to an output terminal of said third inverter and having an output terminal connected to an input terminal of said third inverter.

11. A semiconductor device comprising the bus interface circuit according to claim 1.

12. A semiconductor memory device comprising:
a memory cell array including a plurality of memory cells; and
the bus interface circuit as defined in claim 1,
wherein an output signal of a sense amplifier is supplied to said output circuit of said bus interface circuit, said sense amplifier outputting data read from a memory cell selected from said memory cell array and
wherein said output circuit outputs an output signal to said bus line based on the output signal of said sense amplifier.

13. A receiver circuit receiving data which is output to a bus line, wherein said bus line is precharged to a predetermined precharge voltage during a precharge period before data is output from an output circuit to said bus line, and
wherein a logic amplitude of a signal output to said bus line is determined by the precharge voltage and a power supply voltage of one of first and second power supplies for driving said output circuit and/or receiver circuit,
said receiver circuit comprising:
first and second transistors of second type conductivity, connected in parallel with one of ends thereof tied together to said first power supply, said first transistor controlled to be on and off respectively when the precharge control signal controlling a precharge operation is active and inactive;
a third transistor of first type conductivity, connected between other ends, which are tied together, of said first and second transistors and said bus line and having a control terminal connected to said precharge power supply terminal;
a first inverter having an input terminal connected to a common connection node of said first to third transistor and having an output terminal connected to a control terminal of said second transistor;
a transfer gate having one end connected to the connection node of said first to third transistors and being controlled to be off and on respectively when the precharge control signal is active and inactive; and a buffer circuit having an input terminal connected to another end of said transfer gate and having an output terminal connected to an output terminal of said receiver circuit.

14. A receiver circuit precharging a first bus line and receiving data, wherein said first bus line is precharged to a predetermined precharge voltage during a precharge period before data is output from an output circuit to said first bus line, and wherein a logic amplitude of a signal output to said first bus line is determined by the precharge voltage and a power supply voltage of one of first and second power supplies driving said output circuit and/or receiver circuit, said receiver circuit comprising:

a first transistor of first type conductivity, inserted between a precharge power supply voltage terminal which determines the precharge voltage of said first bus line, and said bus line;

a first inverter having an input terminal for receiving an inverted signal of a precharge control signal for controlling a precharge operation, with the precharge power supply voltage being supplied as a drive power supply voltage, and having an output terminal for outputting a signal at a precharge power supply voltage level to supply the output signal to a gate of said first transistor, when the precharge control signal is active, wherein, when the output signal of said first inverter is at the precharge power supply voltage, said first transistor is turned on to precharge said first bus line;

second and third transistors of second type conductivity, connected in parallel with one of ends thereof tied together to said first power supply, said second transistor having a control terminal for receiving an inverted signal of the precharge control signal and being controlled to be on and off respectively when the precharge control signal is active and inactive;

a fourth transistor of first type conductivity, connected between other ends, which are tied together, of said second and third transistors and said bus line, and having a control terminal connected to said precharge power supply terminal;

a second inverter having an input terminal connected to a common connection node of said second to fourth transistors, said third transistor having a control terminal connected to an output terminal of said second inverter; and a buffer circuit having an input terminal connected to the output terminal of said second inverter and having an output terminal connected to a second bus line.

15. The receiver circuit according to claim 14, wherein said second bus line is precharged by a precharge circuit connected to said second bus line during a precharge period before data is output to said second bus line, and wherein said buffer circuit comprises a fifth transistor being connected between said second bus line and said second power supply, and having a control terminal connected to the output terminal of said second inverter.

16. A semiconductor memory device comprising:

a memory cell array including a plurality of memory cells;

a sense amplifier outputting a signal of a logic value corresponding to data of a memory cell selected from said memory cell array;

a first bus line;

a first bus line driver circuit receiving the signal output from said sense amplifier and driving the first bus line when the output signal of said sense amplifier is one of a first and second logic values;

a first precharge circuit, receiving a first precharge control signal activated every read cycle of said first bus line and precharging said first bus line to a first precharge voltage when the first precharge control signal is activated to indicate a precharge operation; and a first receiver circuit holding a signal output to said first bus line in a preceding read cycle when said first precharge control signal is active and for receiving a signal from said first bus line to convert a level of the received signal for output as an output signal when the first precharge control signal is inactive.

17. The semiconductor memory device according to claim 16, further comprising:

a second bus line driver circuit receiving the output signal of said first receiver circuit and driving a second bus line when the output signal of said first receiver circuit is at a first logic level;

a second precharge circuit receiving a second precharge control signal activated every read cycle of said second bus line and precharging said second bus line to a second precharge voltage when the second precharge control signal is activated to indicate a precharge operation; and a second receiver circuit receiving the second precharge control signal and for receiving a signal from said second bus line to convert a level of the received signal for output as an output signal when the second precharge control signal is inactive.

18. The semiconductor memory device according to claim 17, wherein said first receiver circuit comprises said first precharge circuit that precharges said first bus line, said first precharge circuit comprising:

a first transistor of first type conductivity inserted between a precharge power supply voltage terminal and said bus line; said precharge power supply voltage terminal determining the precharge voltage of said first bus line; and a first inverter, to which the precharge power supply voltage is supplied as a drive power supply voltage, said first inverter having an input terminal for receiving an inverted signal of a precharge control signal for controlling a precharge operation and having an output terminal for outputting a signal at a level of said precharge power supply voltage to feed the signal to a gate of said first transistor, when precharge control signal is active;

wherein said first transistor is turned on to precharge said first bus line when the output signal of said first inverter is at the precharge power supply voltage, wherein the receiver circuit connected to said first bus line comprises:

second and third transistors of second type conductivity connected in parallel with one of ends thereof tied together to a first power supply;

said second transistor having a control terminal for receiving an inverted signal of the precharge control signal and being controlled to be turned on and off when the pre-charge control signal is active and inactive;

a fourth transistor of first type conductivity connected between other ends, which are tied together, of said second and third transistors and said bus line, and having a control terminal connected to the precharge power supply terminal;

a second inverter having an input terminal connected to a common connection node of said second to fourth transistors and having an output terminal connected to a control terminal of said third transistor; and a buffer circuit having an input terminal connected to the output terminal of said second inverter and having an output terminal connected to said second bus line.

19. The semiconductor memory device according to claim 18, wherein said buffer circuit, connected between said second bus and a second power supply, comprises a fifth transistor having a control terminal connected to the output terminal of said second inverter.

* * * * *